United States Patent
Yoshizumi et al.

(10) Patent No.: US 10,312,114 B2
(45) Date of Patent: Jun. 4, 2019

(54) SUBSTRATE PROCESSING METHOD, AND SUBSTRATE PROCESSING DEVICE

(71) Applicant: SCREEN Holdings Co., Ltd., Kyoto (JP)

(72) Inventors: Asuka Yoshizumi, Kyoto (JP); Ayumi Higuchi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/028,243

(22) PCT Filed: Oct. 8, 2014

(86) PCT No.: PCT/JP2014/076976
§ 371 (c)(1),
(2) Date: Apr. 8, 2016

(87) PCT Pub. No.: WO2015/053329
PCT Pub. Date: Apr. 16, 2015

(65) Prior Publication Data
US 2016/0247698 A1 Aug. 25, 2016

(30) Foreign Application Priority Data
Oct. 10, 2013 (JP) .................... 2013-213071

(51) Int. Cl.
*B44C 1/22* (2006.01)
*C23F 1/00* (2006.01)
(Continued)

(52) U.S. Cl.
CPC .. *H01L 21/67075* (2013.01); *H01L 21/02052* (2013.01); *H01L 21/30604* (2013.01);
(Continued)

(58) Field of Classification Search
CPC ......... H01L 21/67075; H01L 21/02052; H01L 21/6704
See application file for complete search history.

(56) References Cited

U.S. PATENT DOCUMENTS

| 8,216,384 B2 * | 7/2012 | Kumar ................. C11D 3/042 134/1 |
| 2007/0154636 A1 * | 7/2007 | Hashizume ............ B05B 7/066 427/240 |

(Continued)

FOREIGN PATENT DOCUMENTS

| JP | 2001-284207 | 10/2001 |
| JP | 2005-191163 A | 7/2005 |

(Continued)

OTHER PUBLICATIONS

International Search Report dated Jan. 13, 2015 in corresponding PCT International Application No. PCT/JP2014/076976.
(Continued)

*Primary Examiner* — Thomas T Pham
(74) *Attorney, Agent, or Firm* — Ostrolenk Faber LLP

(57) ABSTRACT

This substrate processing method includes supplying a chemical liquid to an upper surface of a substrate and rinsing away the chemical liquid adhering to the upper surface of the substrate by holding a puddled rinse liquid on the substrate while maintaining a rotation speed of the substrate at a zero or low speed, and a chemical liquid puddle step of holding a liquid film of a puddled chemical liquid on the upper surface of the substrate while maintaining the rotation speed of the substrate at a zero or low speed, and the rinsing step is performed subsequent to finishing the chemical liquid puddle step, and the rinsing step includes supplying a rinse liquid to the upper surface of the substrate and then replacing the liquid film of the chemical liquid held on the upper surface of the substrate with the rinse liquid.

7 Claims, 10 Drawing Sheets

(51) Int. Cl.
  *C03C 15/00*   (2006.01)
  *C03C 25/68*   (2006.01)
  *C25F 3/00*    (2006.01)
  *H01L 21/67*   (2006.01)
  *H01L 21/02*   (2006.01)
  *H01L 21/306*  (2006.01)
  *H01L 21/687*  (2006.01)
  *H01L 21/311*  (2006.01)

(52) U.S. Cl.
  CPC .... *H01L 21/31111* (2013.01); *H01L 21/6704* (2013.01); *H01L 21/67028* (2013.01); *H01L 21/67051* (2013.01); *H01L 21/68714* (2013.01)

(56) References Cited

U.S. PATENT DOCUMENTS

| | | | |
|---|---|---|---|
| 2009/0032007 A1 | 2/2009 | Kojimaru et al. | 134/26 |
| 2009/0032067 A1* | 2/2009 | Kojimaru | H01L 21/67034 134/26 |
| 2009/0145457 A1 | 6/2009 | Schwab et al. | 134/4 |
| 2010/0154826 A1* | 6/2010 | Printz | H01L 21/67028 134/18 |
| 2011/0143541 A1 | 6/2011 | Ogawa et al. | 438/694 |
| 2012/0074101 A1 | 3/2012 | Nakamura | 216/83 |
| 2012/0183909 A1 | 7/2012 | Inatomi et al. | 430/435 |
| 2013/0224956 A1* | 8/2013 | Negoro | H01L 21/31111 438/697 |

FOREIGN PATENT DOCUMENTS

| | | |
|---|---|---|
| JP | 2006-278955 A | 10/2006 |
| JP | 2009-054985 | 3/2009 |
| JP | 2012-74475 A | 4/2012 |
| TW | 200933717 | 8/2009 |
| TW | 201120584 A1 | 6/2011 |
| TW | 201133584 A1 | 10/2011 |

OTHER PUBLICATIONS

Written Opinion dated Jan. 13, 2015 in corresponding PCT International Application No. PCT/JP2014/076976.

* cited by examiner

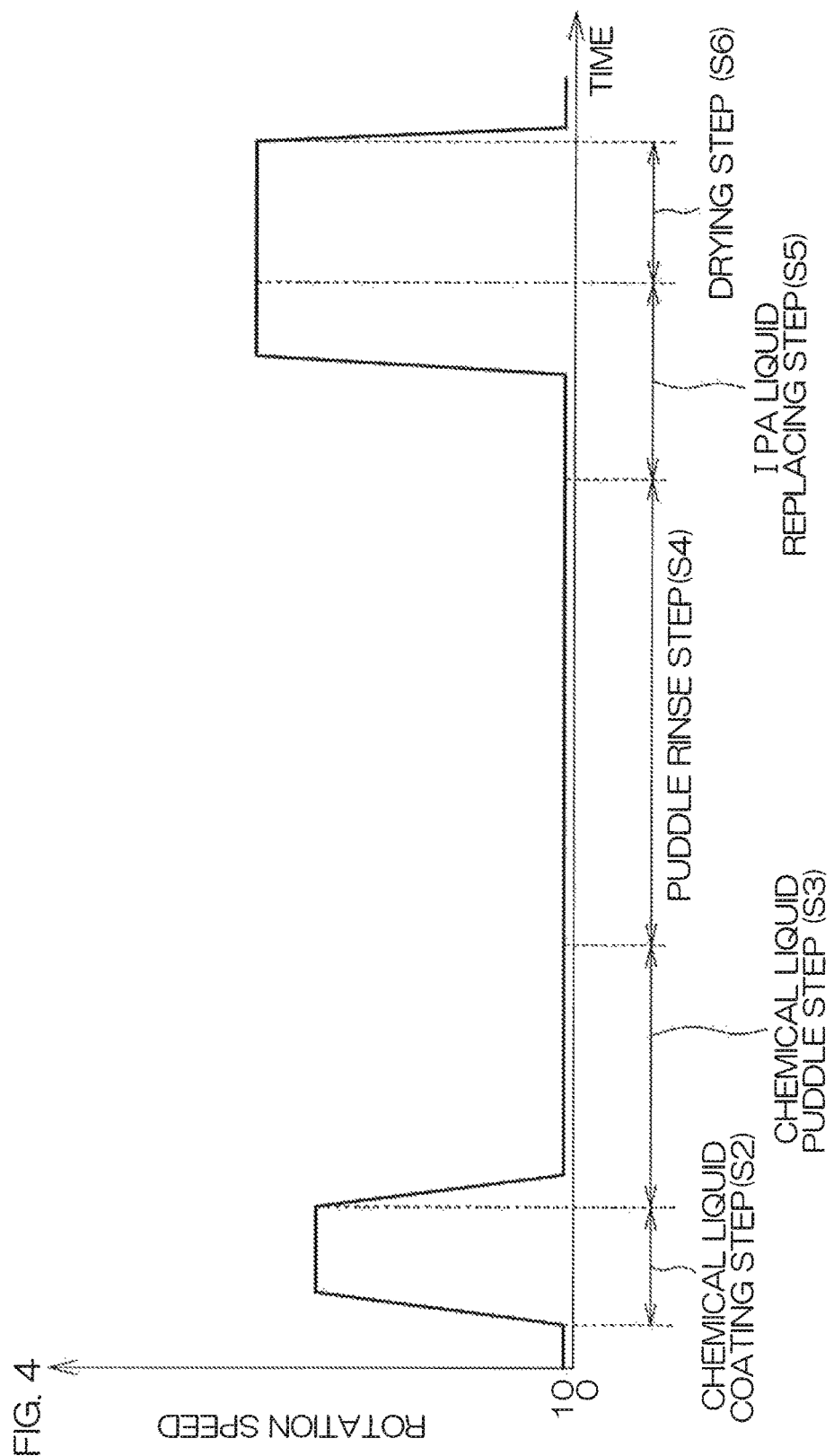

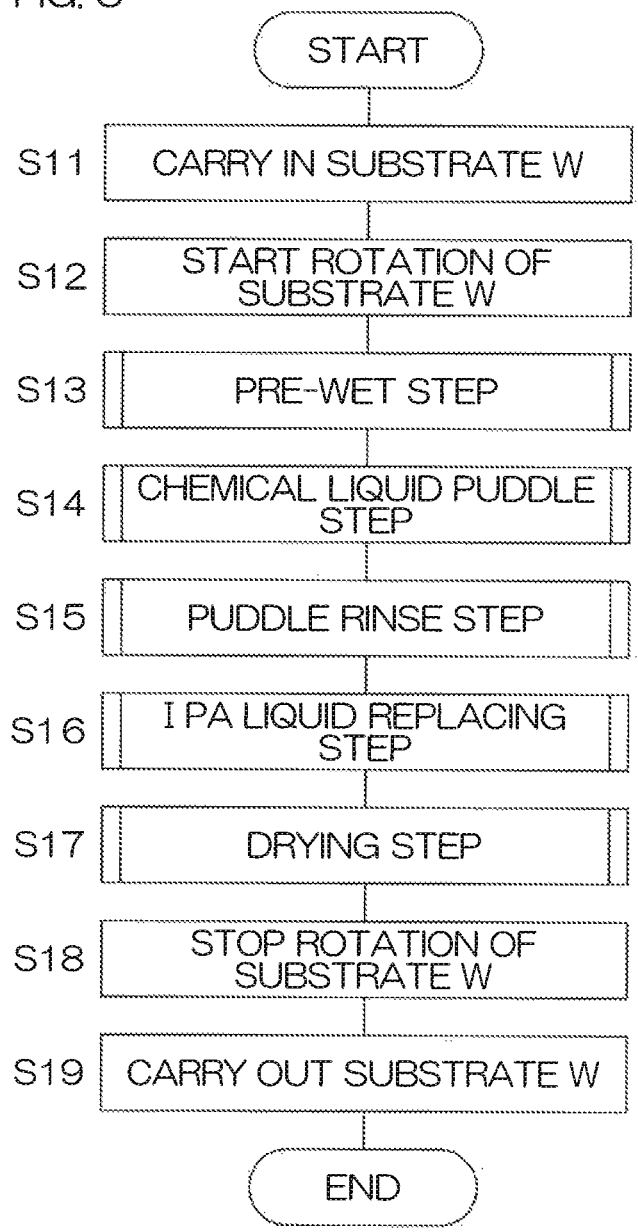

FIG. 8
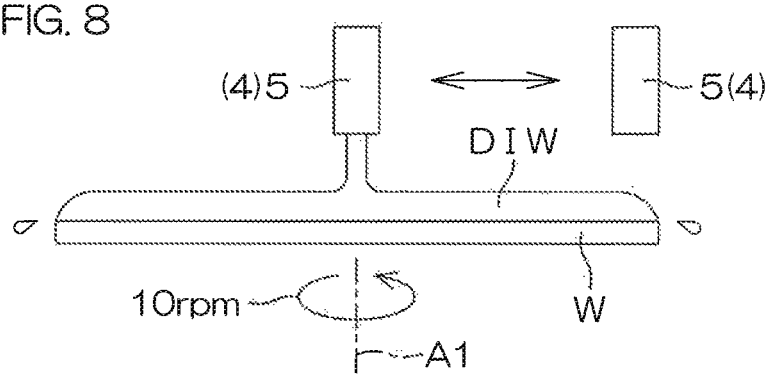
FIG. 9
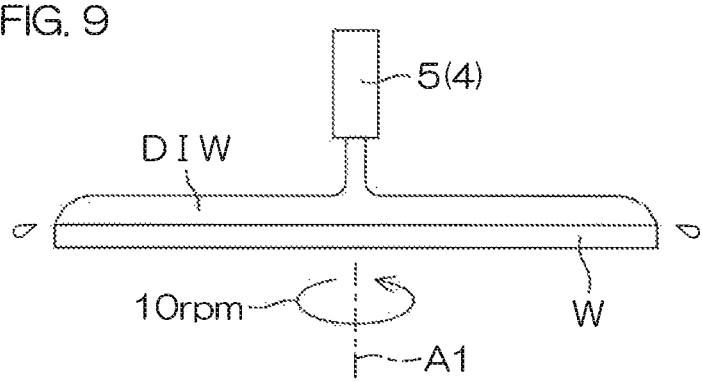
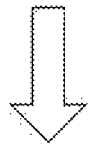
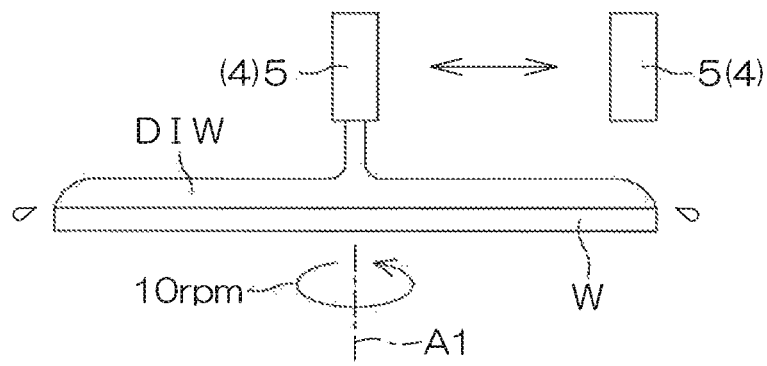

SUBSTRATE PROCESSING METHOD, AND SUBSTRATE PROCESSING DEVICE

CROSS-REFERENCE TO RELATED APPLICATIONS

The present application is a 35 U.S.C. §§ 371 national phase conversion of PCT/JP2014/076976, filed Oct. 8, 2014, which claims priority to Japanese Patent Application No. 2013-213071, filed Oct. 10, 2013, the contents of both of which are incorporated herein by reference. The PCT International Application was published in the Japanese language.

TECHNICAL FIELD

The present invention relates to a substrate processing method and a substrate processing apparatus. Examples of substrates to be processed include semiconductor wafers, substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, and substrates for solar cells.

BACKGROUND ART

In a process for manufacturing a semiconductor device or a liquid crystal display device, a substrate processing apparatus of a single substrate processing type, in which substrates are processed one by one, for example, includes a spin chuck that rotates a substrate while holding the substrate approximately horizontally and a nozzle that discharges a processing liquid toward a central portion of a front surface of the substrate rotated by the spin chuck.

In substrate processing that uses the thus arranged substrate processing apparatus, for example, chemical liquid treatment in which a chemical liquid is supplied to the front surface of the substrate that is rotating is performed. The chemical liquid supplied to the front surface of the substrate receives a centrifugal force generated by the rotation of the substrate, and flows on the front surface of the substrate toward its peripheral edge, and spreads in the whole area of the front surface of the substrate. As a result, processing by the chemical liquid is applied to the whole area of the front surface of the substrate.

After completing the chemical liquid treatment, rinsing in which the chemical liquid adhering to the front surface of the substrate is rinsed away by pure water is performed. In the rinsing, for example, a rinse liquid is supplied to the front surface of the substrate being in a rotational state. The rinse liquid supplied to the front surface of the substrate receives a centrifugal force generated by the rotation of the substrate, and flows on the front surface of the substrate toward its peripheral edge, and spreads in the whole area of the front surface of the substrate. As a result, in the whole area of the front surface of the substrate, the chemical liquid adhering to the front surface of the substrate is rinsed away.

After completing the rinsing, an isopropyl alcohol (IPA) liquid is supplied to the front surface of the substrate. The IPA liquid is supplied in a state in which the rotation speed of the substrate is zero or low, and only a zero or small centrifugal force acts on the IPA liquid, and therefore a state in which the liquid stagnates on the front surface of the substrate because of surface tension so as to form a liquid film (this state is hereinafter referred to as "puddled") is maintained. After the rinse liquid on the front surface of the substrate is replaced with the IPA liquid, the rotation of the substrate is accelerated, and, as a result, the liquid film of the IPA liquid is spun off from the front surface of the substrate, and the substrate is dried.

In the series of processing steps mentioned above, for example, in Patent Document 1, a method (puddle rinse) has been proposed in which, after rinsing is performed, a liquid film of a rinse liquid is held on the front surface of the substrate in a puddled state prior to holding a liquid film of an IPA liquid.

PRIOR ART DOCUMENTS

Patent Documents

Patent Document 1: Japanese Patent Application Publication No. 2009-54985

SUMMARY OF INVENTION

Technical Problem

In the method of Patent Document 1, rinsing is performed while rotating the substrate at a predetermined liquid processing rotation speed, and thereafter the rotation speed of the substrate is decreased from the liquid processing rotation speed to a zero or low speed while continuing discharging a rinse liquid from a nozzle. At this time, only a zero or small centrifugal force acts on the rinse liquid supplied to the substrate, and therefore the rinse liquid stagnates on the front surface of the substrate, and a liquid film of the rinse liquid is held in a puddled state in the whole area of the front surface of the substrate. Thereafter, a rinse liquid included in the liquid film of this rinse liquid is replaced with an IPA liquid, and, as a result, a liquid film of the IPA liquid is held in a puddled state in the whole area of the front surface of the substrate. This makes it possible to hold the liquid film of the rinse liquid and the liquid film of the IPA liquid in this order in the whole area of the front surface of the substrate without exposing the front surface of the substrate.

However, in the method of Patent Document 1, the front surface of the substrate is exposed without being covered with the liquid film during a period ranging from the end of chemical liquid treatment to the start of rinsing. At this time, there is a fear that particles that are floating around the front surface of the substrate will adhere to the front surface of the substrate. It is impossible for rinsing to remove particles that have adhered to the front surface of the substrate after chemical liquid treatment, and there is a fear that the particles will remain on the front surface of the substrate after the series of processing steps.

Therefore, it is an object of the present invention to provide a substrate processing method and a substrate processing apparatus that are capable of applying chemical liquid treatment and rinsing onto an upper surface (front surface) of a substrate without undergoing a process in which the upper surface (front surface) of the substrate is exposed.

Solution to Problem

The present invention provides a substrate processing method including a chemical liquid step of supplying a chemical liquid to an upper surface of a substrate held by a substrate holding unit in a horizontal posture and a puddle rinse step of rinsing away the chemical liquid adhering to the upper surface of the substrate by holding a liquid film of a puddled rinse liquid on the upper surface of the substrate while maintaining a rotation speed of the substrate at a zero speed or at a low speed, and the chemical liquid step includes a chemical liquid puddle step of holding a liquid film of a puddled chemical liquid on the upper surface of the substrate while maintaining the rotation speed of the substrate at a zero speed or at a low speed, and the puddle rinse step is performed subsequent to a finish of the chemical liquid puddle step, and the puddle rinse step includes a step of supplying a rinse liquid to the upper surface of the substrate and then replacing the liquid film of the chemical liquid held on the upper surface of the substrate with the rinse liquid.

According to this method, the liquid film of a chemical liquid with which the upper surface of a substrate is covered is held on the upper surface thereof in the chemical liquid puddle step that is included in the chemical liquid step. Subsequent to the end of the chemical liquid puddle step, the liquid film of the chemical liquid held on the upper surface of the substrate is replaced with a rinse liquid. The liquid film of the rinse liquid with which the upper surface of the substrate is covered is held on the upper surface thereof by the rinse liquid replacement, and a chemical liquid adhering to the upper surface of the substrate is rinsed away by the liquid film of the rinse liquid (puddle rinse step). The liquid film of the chemical liquid held by the substrate is replaced with the rinse liquid, and the liquid film of the rinse liquid is formed on the upper surface of the substrate, and therefore the upper surface of the substrate is not exposed when a shift is made from chemical liquid treatment to rinsing. This makes it possible to apply chemical liquid treatment and rinsing onto the upper surface of the substrate without undergoing a process in which the upper surface of the substrate is exposed.

The chemical liquid may be an etching liquid.

Additionally, the upper surface of the substrate that has not yet undergone the puddle rinse step may exhibit hydrophobic properties.

Additionally, in one preferred embodiment of the present invention, the chemical liquid puddle step is performed throughout an entire period of time of the chemical liquid step.

According to this method, the rotation speed of the substrate is maintained at a zero speed or at a low speed throughout the entire period of time of the chemical liquid step. Therefore, the chemical liquid discharged from the substrate is restrained or prevented from hitting peripheral members and from rebounding to the substrate. Therefore, particles included in the chemical liquid that has rebounded are restrained or prevented from adhering to the substrate. This makes it possible to raise the cleanliness of the substrate.

The method may include a pre-supply step of supplying water to the upper surface of the substrate and holding a liquid film of water on the upper surface prior to performing the chemical liquid puddle step, and the chemical liquid puddle step may include a step of supplying a chemical liquid to the upper surface of the substrate and then replacing the liquid film of water held on the upper surface of the substrate with the chemical liquid.

According to this method, the pre-supply step is performed prior to performing the chemical liquid puddle step, and the liquid film of water is formed on the front surface of the substrate. In the chemical liquid puddle step, water is successively replaced with the chemical liquid from the center portion of the liquid film of water toward the peripheral edge thereof, and therefore the replacing speed from water to the chemical liquid gradually becomes lower in proportion to an approach from the center portion of the substrate to the peripheral edge thereof. As a result, the rate of chemical liquid treatment in the chemical liquid puddle step gradually becomes lower in proportion to an approach from the rotational center of the substrate to the peripheral edge thereof.

On the other hand, in the puddle rinse step, the chemical liquid is successively replaced with water from the center portion of the liquid film of the chemical liquid toward the peripheral edge thereof, and therefore the replacing speed from the chemical liquid to water gradually becomes lower in proportion to an approach from the center portion of the substrate to the peripheral edge thereof. As a result, contrary to that in the chemical liquid puddle step, the rate of chemical liquid treatment in the puddle rinse step gradually becomes higher in proportion to an approach from the rotational center of the substrate to the peripheral edge thereof.

Thus, characteristics of chemical liquid treatment between both steps is offset by combining together the two steps that differ from each other in characteristics of chemical liquid treatment. As a result, a difference in the rate of chemical liquid treatment between the center of the substrate and the peripheral edge thereof is reduced. Therefore, in the entire chemical liquid treatment that includes both of the chemical liquid puddle step and the puddle rinse step, it is possible to maintain the in-plane uniformity of the rate of chemical liquid treatment, and it is possible to uniformly apply chemical liquid treatment onto the upper surface of the substrate.

The method may additionally include a low surface tension liquid replacing step of, after finishing the puddle rinse step, supplying a low surface tension liquid whose surface tension is lower than the rinse liquid to the upper surface of the substrate and then replacing a liquid film of a puddled rinse liquid held on the upper surface of the substrate with the low surface tension liquid.

The method may additionally include a chemical liquid supply position moving step of moving a supply position of the chemical liquid in the upper surface of the substrate in the chemical liquid puddle step.

According to this method, in the chemical liquid puddle step, the supply position of the chemical liquid in the substrate is scanned, and therefore the liquid film of the chemical liquid on the upper surface of the substrate is stirred, and a fresh chemical liquid is brought into contact with the upper surface of the substrate. As a result, it is possible to improve the processing efficiency of the chemical liquid (the etching efficiency if the chemical liquid is an etching liquid) in the chemical liquid puddle step.

The method may additionally include a rinse liquid supply position moving step of moving a supply position of the rinse liquid in the upper surface of the substrate in the puddle rinse step.

According to this method, in the puddle rinse step, the supply position of a rinse liquid in the substrate is scanned, and therefore a liquid film (a mixed liquid film of a chemical liquid and a rinse liquid) on the upper surface of the substrate is stirred, thus making it possible to improve the replacing efficiency from the chemical liquid to the rinse liquid. As a result, it is possible to improve the rinse efficiency in the puddle rinse step.

The present invention provides a substrate processing method that includes a substrate holding unit that holds a substrate in a horizontal posture, a substrate rotating unit that rotates the substrate around a vertical rotational axis, a chemical liquid supply unit that supplies a chemical liquid to a front surface of the substrate, a rinse liquid supply unit that supplies a rinse liquid to the front surface of the substrate, and a control unit that performs a chemical liquid puddle step of supplying a chemical liquid to an upper surface of the substrate and holding a liquid film of a puddled chemical liquid on the upper surface of the substrate while controlling the substrate rotating unit, the chemical liquid supply unit, and the rinse liquid supply unit and while maintaining a rotation speed of the substrate at a zero speed or at a low speed and a puddle rinse step of, subsequent to a finish of the chemical liquid puddle step, rinsing away the chemical liquid adhering to the upper surface of the substrate by holding the liquid film of the puddled rinse liquid on the upper surface of the substrate while maintaining a rotation speed of the substrate at a zero speed or at a low speed and that performs a step of, in the puddle rinse step, supplying a rinse liquid to the upper surface of the substrate and then replacing the liquid film of the chemical liquid held on the upper surface of the substrate with the rinse liquid.

According to this arrangement, the liquid film of a chemical liquid with which the upper surface of a substrate is covered is held on the upper surface thereof in the chemical liquid puddle step that is included in the chemical liquid step. Subsequent to the end of the chemical liquid puddle step, the liquid film of the chemical liquid held on the upper surface of the substrate is replaced with a rinse liquid. The liquid film of the rinse liquid with which the upper surface of the substrate is covered is held on the upper surface thereof by this rinse liquid replacement, and a chemical liquid adhering to the upper surface of the substrate is rinsed away by the liquid film of the rinse liquid (puddle rinse step). The liquid film of the chemical liquid held on the substrate is replaced with the rinse liquid, and the liquid film of the rinse liquid is formed on the upper surface of the substrate, and therefore the upper surface of the substrate is not exposed when a shift is made from chemical liquid treatment to rinsing. This makes it possible to apply chemical liquid treatment and rinsing onto the upper surface of the substrate without undergoing a process in which the upper surface of the substrate is exposed.

The aforementioned or other objects, features, and advantages of the present invention will become more apparent from the following description of preferred embodiments with reference to the attached drawings.

BRIEF DESCRIPTION OF DRAWINGS

FIG. 4 is a view showing a change in the rotation speed of a substrate in each step included in the processing example of FIG. 3.

FIG. 5 is a flowchart showing a second processing example of washing performed by the substrate processing apparatus shown in FIG. 1.

FIG. 8 is a flowchart showing a third processing example of washing performed by the substrate processing apparatus shown in FIG. 1.

FIG. 9 is a flowchart showing a fourth processing example of washing performed by the substrate processing apparatus shown in FIG. 1.

DESCRIPTION OF EMBODIMENTS

Figure 1:
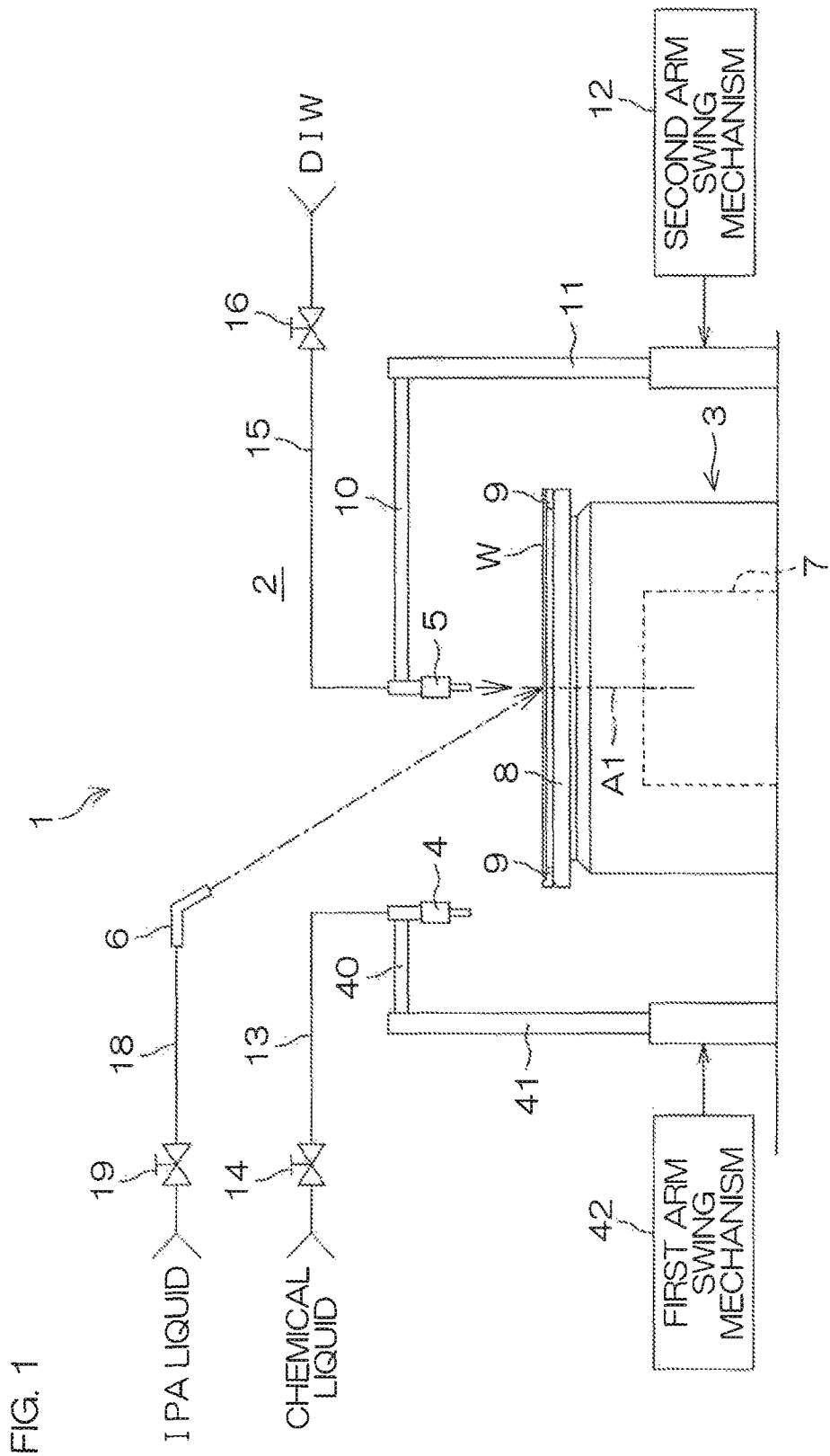
FIG. 1 is a view schematically showing an arrangement of a substrate processing apparatus according to a preferred embodiment of the present invention.

FIG. 1 is a view that schematically shows an arrangement of a substrate processing apparatus 1 according to a preferred embodiment of the present invention.

This substrate processing apparatus 1 is a single substrate processing type apparatus that applies washing onto a front surface (surface to be processed) of a substrate W such as a semiconductor wafer.

The substrate processing apparatus 1 includes, in a processing chamber 2 defined by a partition wall (not shown), a spin chuck 3 that holds and rotates a substrate W, a chemical liquid nozzle 4 through which a chemical liquid is supplied to the front surface (upper surface) of the substrate W held by the spin chuck 3, a rinse liquid nozzle (rinse liquid supply unit) 5 through which DIW (deionized water) that is one example of a rinse liquid is supplied to the upper surface of the substrate W held by the spin chuck 3, and an organic solvent nozzle (organic solvent supply unit) 6 through which an isopropyl alcohol (IPA) liquid that is one example of an organic solvent having low surface tension is supplied.

For example, a gripping-type chuck is employed as the spin chuck 3. More specifically, the spin chuck 3 is composed of a spin motor (substrate rotating unit) 7, a spin shaft (not shown) formed integrally with a driving shaft of the spin motor 7, a disk-shaped spin base 8 substantially horizontally attached to the upper end of the spin shaft, and a plurality of gripping members 9 substantially equiangularly spaced at a plurality of places, respectively, of the peripheral edge of the spin base 8. The gripping members 9 grip and sandwich the substrate W therebetween in a substantially horizontal posture. When the spin motor 7 is driven in this state, the spin base 8 is rotated around a predetermined rotational axis (vertical axis) A1 by means of its driving force, and the substrate W is rotated around the rotational axis A1 together with the spin base 8 while maintaining a substantially horizontal posture.

A chuck to be employed as the spin chuck 3 is not limited to the gripping-type chuck, and, for example, a vacuum suction type chuck may be employed which holds a substrate W in a horizontal posture by vacuum-sucking the rear surface (undersurface) of the substrate W and which rotates around the rotational axis A1 in that state so as to rotate the substrate W held thereby.

The chemical liquid nozzle 4 is, for example, a straight nozzle through which a chemical liquid is discharged in a continuous flow state, and is fixedly disposed above the spin chuck 3 in a state in which its discharge port is directed toward the neighborhood of the rotational center of the upper surface of the substrate W. A chemical liquid supply pipe 13 through which a chemical liquid sent from a chemical liquid supply source is supplied is connected to the chemical liquid nozzle 4. A chemical liquid valve (chemical liquid supply unit) 14 to perform switching between the supply and the supply stop of a chemical liquid from the chemical liquid nozzle 4 is interposed in the chemical liquid supply pipe 13. For example, diluted hydrofluoric acid (DHF), concentrated hydrofluoric acid (concHF), nitrohydrofluoric acid (mixed liquid of hydrofluoric acid and nitric acid ($HNO_3$)), or ammonium fluoride, etc., is used as the chemical liquid.

The chemical liquid nozzle 4 is, for example, a straight nozzle through which a chemical liquid is discharged in a continuous flow state, and has a basic form as a scanning nozzle that is capable of changing a chemical liquid supply position in the upper surface of the substrate W.

The chemical liquid nozzle 4 is supported by a forward end of a first arm 40 that extends substantially horizontally above the spin chuck 3. A basal end of the first arm 40 is fixed to an upper end of a first arm support shaft 41 that extends substantially vertically beside the spin chuck 3. A first arm swing mechanism 42 composed of a motor etc., is combined with the first arm support shaft 41. The swing of the first arm 40 by means of the first arm swing mechanism 42 makes it possible to move the chemical liquid nozzle 4 between a space above the rotational center of the substrate W held by the spin chuck 3 (on the rotational axis A1) and a home position located beside the spin chuck 3.

The chemical liquid supply pipe 13 through which a chemical liquid from the chemical liquid supply source is supplied is connected to the chemical liquid nozzle 4. The chemical liquid valve 14 to perform switching between the supply and the supply stop of a chemical liquid from the chemical liquid nozzle 4 is interposed in the chemical liquid supply pipe 13. For example, diluted hydrofluoric acid (DHF), concentrated hydrofluoric acid (concHF), nitrohydrofluoric acid (mixed liquid of hydrofluoric acid and nitric acid ($HNO_3$)), or ammonium fluoride, etc., is used as the chemical liquid.

The rinse liquid nozzle 5 is, for example, a straight nozzle through which DIW is discharged in a continuous flow state, and has a basic form as a scanning nozzle that is capable of changing a DIW supply position in the upper surface of the substrate W.

The rinse liquid nozzle 5 is supported by a forward end of a second arm 10 that extends substantially horizontally above the spin chuck 3. A basal end of the second arm 10 is fixed to an upper end of a second arm support shaft 11 that extends substantially vertically beside the spin chuck 3. A second arm swing mechanism 12 composed of a motor etc., is combined with the second arm support shaft 11. The swing of the second arm 10 by means of the second arm swing mechanism 12 makes it possible to move the rinse liquid nozzle 5 between a space above the rotational center of the substrate W held by the spin chuck 3 (on the rotational axis A1) and a home position located beside the spin chuck 3.

A rinse liquid supply pipe 15 through which DIW from a DIW supply source is supplied is connected to the rinse liquid nozzle 5. A rinse liquid valve 16 (rinse liquid supply unit) to perform switching between the supply and the supply stop of DIW from the rinse liquid nozzle 5 is interposed in a halfway portion of the rinse liquid supply pipe 15.

The organic solvent nozzle 6 is, for example, a straight nozzle through which an IPA liquid is discharged in a continuous flow state, and is fixedly disposed above the spin chuck 3 in a state in which its discharge port is directed toward the neighborhood of the rotational center of the upper surface of the substrate W. An organic solvent supply pipe 18 through which an IPA liquid sent from an IPA liquid supply source is supplied is connected to the organic solvent nozzle 6. An organic solvent valve 19 to perform switching between the supply and the supply stop of an IPA liquid from the organic solvent nozzle 6 is interposed in the organic solvent supply pipe 18.

The organic solvent nozzle 6 and the spin chuck 3 are not required to be disposed fixedly with respect to each other, and, for example, a so-called scanning nozzle type may be employed in which the organic solvent nozzle 6 is attached to a swingable arm in a horizontal plane above the spin chuck 3 so that the solvent adhesion position of the organic solvent in the upper surface of the substrate W is scanned by the swing of the arm.

Figure 2:
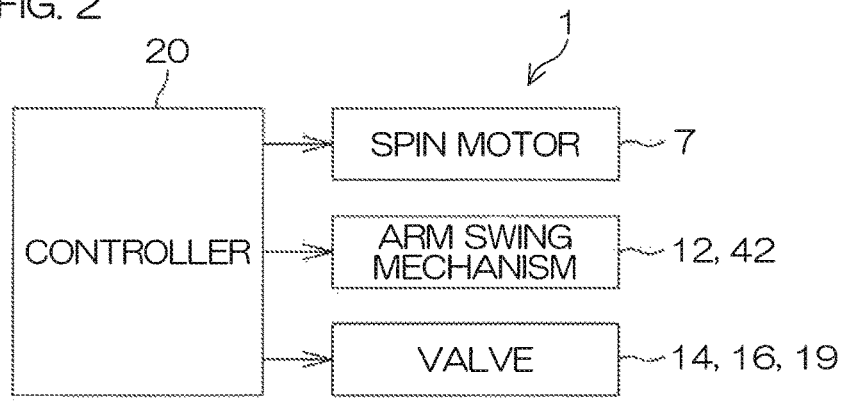
FIG. 2 is a block diagram showing an electric arrangement of the substrate processing apparatus shown in FIG. 1.

FIG. 2 is a block diagram showing an electric arrangement of the substrate processing apparatus 1.

The substrate processing apparatus 1 includes a controller (control unit) 20 arranged to include a microcomputer. The controller 20 operationally controls the spin motor 7, the first and second arm swing mechanisms 42 and 12, etc., in accordance with a predetermined program. Furthermore, the controller 20 controls the open-close operations of the chemical liquid valve 14, the rinse liquid valve 16, the organic solvent valve 19, etc.

Figure 3:
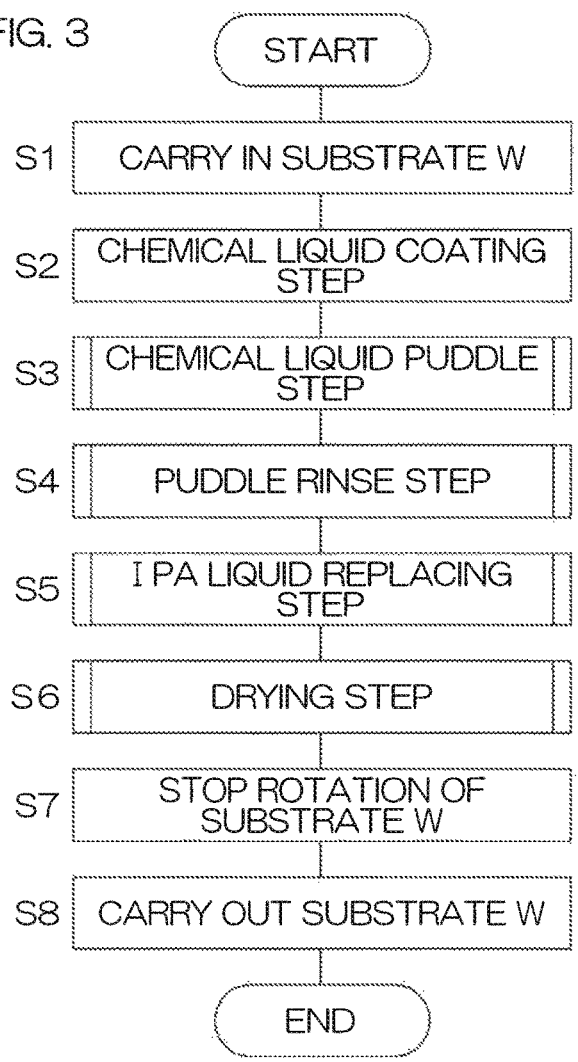
FIG. 3 is a flowchart showing a first processing example of washing performed by the substrate processing apparatus shown in FIG. 1.

FIG. 3 is a flowchart showing a first processing example of washing performed by the substrate processing apparatus 1. FIG. 4 is a view showing a change in rotation speed of a substrate W in each step included in washing.

The first processing example of washing will be described with reference to FIG. 1 to FIG. 4.

Oxide film etching to remove an oxide film formed on the front surface (surface on which a device should be formed) of the substrate W will be mentioned and described as the first processing example of washing. In washing, a transfer robot (not shown) is controlled, and an unprocessed substrate W is carried into a processing chamber 2 (see FIG. 1) (step S1). A silicon wafer having its front surface on which an oxide film is formed can be mentioned as an example of the substrate W. The substrate W may be a large-sized substrate (e.g., a circular substrate having an outer diameter of 450 mm). The substrate W is delivered to the spin chuck 3 in a state in which its front surface is directed upwardly. At this time, the chemical liquid nozzle 4 and the rinse liquid nozzle 5 are disposed in home positions, respectively, so as not to hinder the carry-in of the substrate W.

When the substrate W is held by the spin chuck 3, the controller 20 starts a chemical liquid coating step (step S2).

Specifically, the controller 20 starts rotating the substrate W while controlling the spin motor 7, and increases the rotation speed of the substrate W to a comparatively high rotation level (e.g., 600 to 1200 rpm). In parallel with this, the controller 20 moves the chemical liquid nozzle 4 to a space above the substrate W while controlling the first arm swing mechanism 42, and disposes the chemical liquid nozzle 4 on the rotational center (the rotational axis A1) of the substrate W. When the chemical liquid nozzle 4 is disposed on the rotational center of the substrate W, the controller 20 opens the chemical liquid valve 14, and discharges a chemical liquid from the chemical liquid nozzle 4 toward the middle of the upper surface of the substrate W. The discharge flow amount of the chemical liquid discharged from the chemical liquid nozzle 4 at this time is set at, for example, 2.0 (liter/minute). The chemical liquid supplied from the chemical liquid nozzle 4 to the center portion of the substrate W is expanded by a centrifugal force, and the entire front surface of the substrate W is covered with a liquid film of the chemical liquid. Thereafter, chemical liquid treatment is started in the whole area of the front surface of the substrate W.

When a predetermined period of time elapses and when the whole area of the front surface of the substrate W is covered with the liquid film of the chemical liquid, the controller 20 starts a chemical liquid puddle step in which a liquid film of a puddled chemical liquid is formed and held on the upper surface of a substrate W (step S3). More specifically, the controller 20 decreases the rotation speed of the substrate W to a rotation speed (e.g., about 10 rpm) lower than in the chemical liquid coating step (step S2) in a short time while controlling the spin motor 7. The discharge flow amount of the chemical liquid discharged from the chemical liquid nozzle 4 is maintained at 2.0 (liter/minute). As a result of a decrease in rotation speed of the substrate W, the chemical liquid supplied from the chemical liquid nozzle 4 is stagnated on the front surface of the substrate W, and forms a liquid film of a puddled chemical liquid without being scattered from the front surface of the substrate W.

The rotation speed of a substrate W during the formation of a puddled liquid film is not limited to the aforementioned numerical values, and may be set at an arbitrary rotation speed that makes it possible to heap up a chemical liquid in a puddled state, or may be set at a zero, i.e., the substrate W may be made stationary. In other words, the rotation speed of the substrate W is set at a speed (puddle speed) at which a centrifugal force that acts on the liquid film of the chemical liquid on the front surface of the substrate W becomes smaller than surface tension that acts between the chemical liquid and the front surface of the substrate W or at which the centrifugal force and the surface tension contend with each other substantially equally.

The whole area of the upper surface of the substrate W is chemically processed by the liquid film of the chemical liquid. Additionally, the rotation speed of the substrate W is held at the puddle speed, and therefore the chemical liquid discharged from the substrate W is restrained or prevented from hitting peripheral members and from rebounding to the substrate W.

When a predetermined chemical liquid treatment period of time elapses after starting to discharge a chemical liquid, the controller 20 closes the chemical liquid valve 14, and stops to discharge the chemical liquid from the chemical liquid nozzle 4, and the controller 20 returns the chemical liquid nozzle 4 that has stopped to discharge the chemical liquid to its home position while controlling the first arm swing mechanism 42. When an etching liquid, such as diluted hydrofluoric acid, concentrated hydrofluoric acid, nitrohydrofluoric acid, or ammonium fluoride, is used as the chemical liquid, the front surface of the substrate W that has undergone chemical liquid treatment becomes hydrophobic.

Thereafter, the controller 20 starts a puddle rinse step in which a chemical liquid on the upper surface of a substrate W is replaced with a rinse liquid (DIW) (step S4). When the puddle rinse step (step S4) is started, the controller 20 maintains the substrate rotation speed in the chemical liquid puddle step (S3). Additionally, the controller 20 moves the rinse liquid nozzle 5 to a space above the substrate W while controlling the second arm swing mechanism 12, and disposes the rinse liquid nozzle 5 on the rotational center of the substrate W. When the rinse liquid nozzle 5 is disposed on the rotational center of the substrate W, the controller 20 opens the rinse liquid valve 16 so as to discharge DIW from the rinse liquid nozzle 5 toward the middle of the upper surface of the substrate W. The discharge flow amount of DIW discharged from the rinse liquid nozzle 5 at this time is set at, for example, 2.0 (liter/minute). During a period of time during which a shift is performed from the chemical liquid puddle step (step S3) to the puddle rinse step (step S4), the rotation speed of the substrate W is maintained at a puddle speed, and therefore the upper surface of the substrate W continues being entirely covered with a liquid film of a puddled chemical liquid throughout this period, and the upper surface of the substrate W avoids being exposed.

When DIW is further supplied from the rinse liquid nozzle 5 toward the center portion of the liquid film, the liquid film of the chemical liquid on the substrate W is successively pushed out from the center portion of the substrate W toward the outside of the substrate W, and is then discharged outwardly from the peripheral edge of the substrate W, and is replaced with DIW.

When a predetermined period of time elapses, the entire liquid film of the chemical liquid on the substrate W is replaced by DIW, and a liquid film of DIW is formed in the whole area of the upper surface of the substrate W in a puddled state. A chemical liquid adhering to this upper surface is rinsed away by this liquid film of DIW in the whole area of the upper surface of the substrate W.

The substrate rotation speed in the puddle rinse step (step S4) is set at a puddle speed (e.g., 10 rpm). A centrifugal force that acts on the chemical liquid and DIW placed on the substrate W is small, and therefore the chemical liquid and DIW are restrained in the amount by which the chemical liquid and DIW scatter outwardly from the peripheral edge of the substrate W. The substrate W is rotated at the puddle speed in this way, and therefore the liquid film of puddled DIW continues remaining on the upper surface of the substrate W through the puddle rinse step (step S4). Therefore, it is possible for the front surface of the substrate W to reliably avoid being exposed in the puddle rinse step (step S4).

When a predetermined rinsing period of time elapses after starting to discharge DIW, the controller 20 closes the rinse liquid valve 16, and stops to discharge DIW from the rinse liquid nozzle 5, and the controller 20 returns the rinse liquid nozzle 5 that has stopped to discharge DIW to its home position while controlling the second arm swing mechanism 12.

Thereafter, the controller 20 starts performing an IPA liquid replacing step (low surface tension liquid replacing step: step S5). Specifically, the controller 20 opens the organic solvent valve 19 while maintaining the rotation speed of the substrate W at a puddle speed (e.g., 10 rpm), and discharges an IPA liquid from the organic solvent nozzle 6 toward the neighborhood of the rotational center of the substrate W. The discharge flow amount of the IPA liquid discharged from the organic solvent nozzle 6 at this time is set at, for example, 0.1 (liter/minute). An IPA liquid is supplied to the upper surface of the substrate W, and, as a result, DIW included in the liquid film of DIW on the upper surface of the substrate W is successively replaced with the IPA liquid. As a result, the liquid film of the IPA liquid with which the whole area of the upper surface of the substrate W is covered is formed on the upper surface of the substrate W in a puddled state.

When a predetermined IPA puddle period of time elapses after starting to discharge an IPA liquid, the controller 20 controls the spin motor 7, and stepwisely accelerates the substrate W from a puddle speed to a high rotational speed while continuing to discharge the IPA liquid. After the substrate W reaches the high rotational speed, the controller 20 closes the organic solvent valve 19, and stops to discharge the IPA liquid from the organic solvent nozzle 6 on the condition that the IPA treatment period of time has elapsed from the start of discharging the IPA liquid.

When the IPA liquid stops being discharged, the controller 20 performs a drying step (step S6). In other words, the controller 20 maintains the rotation speed of the substrate W at a high rotation level (e.g., 600 to 1200 rpm). As a result, the IPA liquid adhering to the substrate W is shaken off, and the substrate W is dried.

The drying step (S6) is performed during a predetermined drying period of time, and then the controller 20 drives the spin motor 7, and stops the rotation of the spin chuck 3 (rotation of the substrate W) (step S7). As a result, washing applied to the single substrate W is ended, and the already-processed substrate W is carried out from the processing chamber 2 by means of the transfer robot (step S8).

As thus described, in the first processing example, the upper surface of the substrate W continues being coated by the puddled liquid film throughout a period from the chemical liquid puddle step (step S3) to the beginning of the IPA replacing step (step S5), and the upper surface of the substrate W is never exposed. This makes it possible to protect the upper surface of the substrate W from being contaminated by particles.

FIG. 5 is a flowchart showing a second processing example of washing performed by the substrate processing apparatus 1. FIG. 6A to FIG. 6E are views showing the second processing example of washing performed by the substrate processing apparatus 1.

The second processing example of washing shown in FIG. 5 differs from the first processing example of washing shown in FIG. 3 in the fact that a pre-wet step (pre-supply step: step S13) is performed prior to performing a chemical liquid puddle step (step S14). The second processing example of washing will be hereinafter described with reference to FIG. 1, FIG. 2, and FIG. 5 to FIG. 6E while being focused on points in which the second processing example differs from the first processing example. In this second processing example, oxide film etching to remove an oxide film formed on the front surface of a substrate W made of a silicon wafer (large-sized circular substrate of 450 mm in outer diameter) is mentioned as an example and is described in the same way as in the first processing example.

In washing, the transfer robot is controlled, and an unprocessed substrate W is carried into the processing chamber 2 (see FIG. 1), and is delivered to the spin chuck 3 in a state in which its front surface is directed upwardly (step S11).

The substrate W is held by the spin chuck 3, and then the substrate W starts being rotated while controlling the spin motor 7 (step S12).

Thereafter, the pre-wet step (step S13) is performed by the controller 20. The pre-wet step (S13) is a step in which a DIW liquid film with which the upper surface of the substrate W is covered is formed and held on the upper surface in a puddled state.

Figure 6A:
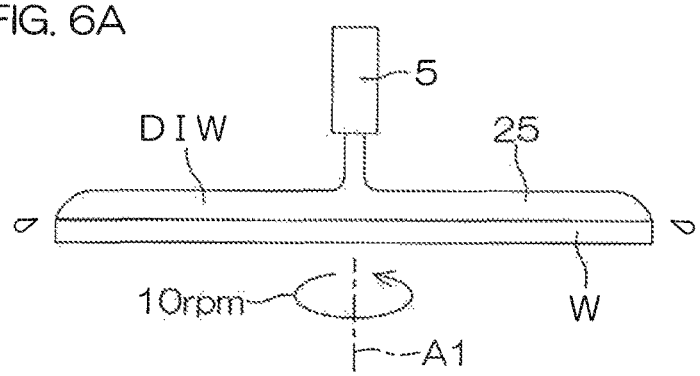
FIG. 6A is a view showing the second processing example of FIG. 5.

When the rotation speed of the substrate W reaches a puddle speed, the controller 20 moves the rinse liquid nozzle 5 to a space above the substrate W while controlling the arm swing mechanism 12, and disposes the rinse liquid nozzle 5 on the rotational center (rotational axis A1) of the substrate W. Furthermore, when the rinse liquid nozzle 5 is disposed on the rotational center of the substrate W, the controller 20 opens the rinse liquid valve 16 so as to discharge DIW from the rinse liquid nozzle 5 toward the middle of the upper surface of the substrate W. The discharge flow amount of DIW discharged from the rinse liquid nozzle 5 at this time is set at, for example, 2.0 (liter/minute). DIW supplied to the middle of the upper surface of the substrate W adheres to the middle of the upper surface of the substrate W, and spreads outwardly on the substrate W while being pressed by the following DIW. Furthermore, the rotation speed of the substrate W is a puddle speed, and the centrifugal force that acts on DIW residing on the substrate W becomes smaller than the surface tension that acts between DIW and the front surface of the substrate W, and therefore DIW supplied to the substrate W is heaped up on the substrate W without scattering to a space around the substrate W. Therefore, a DIW liquid film 25 is formed in the whole area of the upper surface of the substrate W in a puddled state as shown in FIG. 6A.

When a predetermined pre-wet period of time elapses after starting to discharge DIW, the controller 20 closes the rinse liquid valve 16, and stops to discharge DIW from the rinse liquid nozzle 5, and the controller 20 returns the rinse liquid nozzle 5 that has stopped to discharge DIW to its home position while controlling the second arm swing mechanism 12.

Figure 6B:
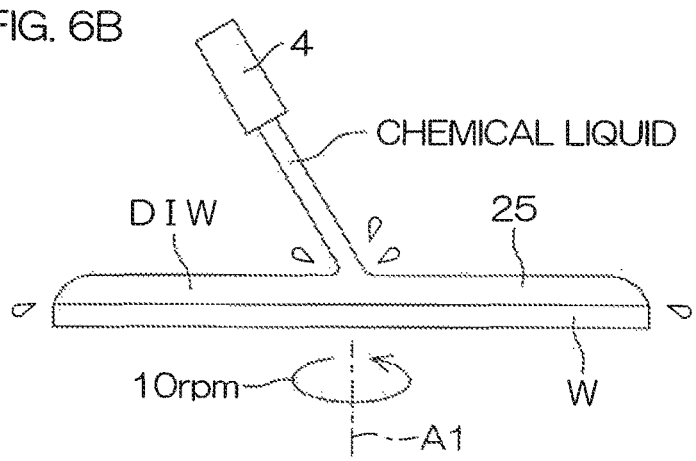
FIG. 6B is a view showing processing performed subsequent to FIG. 6A.
Figure 6C:
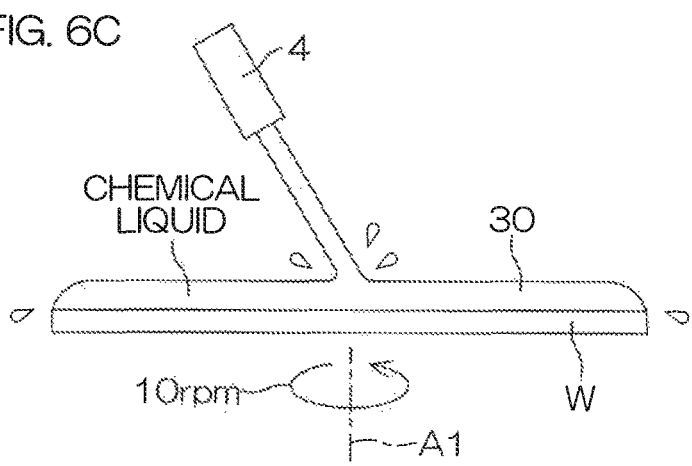
FIG. 6C is a view showing processing performed subsequent to FIG. 6B.

Thereafter, the controller 20 starts performing the chemical liquid puddle step (step S14). Specifically, the controller 20 moves the chemical liquid nozzle 4 to a space above the substrate W while controlling the first arm swing mechanism 42, and disposes the chemical liquid nozzle 4 on the rotational center of the substrate W. Furthermore, when the chemical liquid nozzle 4 is disposed on the rotational center of the substrate W, the controller 20 opens the chemical liquid valve 14 so as to discharge a chemical liquid from the chemical liquid nozzle 4 toward the middle of the upper surface of the substrate W. The discharge flow amount of the chemical liquid discharged from the chemical liquid nozzle 4 at this time is set at, for example, 2.0 (liter/minute). When the chemical liquid puddle step (S14) starts being performed, the DIW liquid film 25 is held in a puddled state on the upper surface of the substrate W as shown in FIG. 6A. A chemical liquid is supplied from the chemical liquid nozzle 4 to the middle of the DIW liquid film 25 as shown in FIG. 6B. As a result, the DIW liquid film 25 on the substrate W is replaced by the chemical liquid successively from the center portion of the substrate W. Thereafter, all of the liquid film 25 of the rinse liquid on the substrate W is replaced by the chemical liquid, and the liquid film 30 of the chemical liquid is formed in the whole area of the upper surface of the substrate W in a puddled state as shown in FIG. 6C. The rotation speed of the substrate W is held at a puddle speed (e.g., 10 rpm), and therefore the chemical liquid discharged from the substrate W is restrained or prevented from hitting peripheral members and from rebounding to the substrate W.

When a predetermined chemical liquid treatment period of time elapses after starting to discharge a chemical liquid, the controller 20 closes the chemical liquid valve 14, and stops to discharge the chemical liquid from the chemical liquid nozzle 4, and the controller 20 returns the chemical liquid nozzle 4 that has stopped to discharge the chemical liquid to its home position while controlling the first arm swing mechanism 42. When diluted hydrofluoric acid, concentrated hydrofluoric acid, nitrohydrofluoric acid, or ammonium fluoride, etc., is used as the chemical liquid, the front surface of the substrate W that has undergone chemical liquid treatment becomes hydrophobic.

Thereafter, the controller 20 starts performing a puddle rinse step (step S15) in which a liquid film 30 of a puddled chemical liquid held on the upper surface of the substrate W is replaced with DIW. When the puddle rinse step (step S15) is started, the controller 20 maintains the substrate rotation speed in the chemical liquid puddle step (step S14). The controller 20 moves the rinse liquid nozzle 5 to a space above the substrate W while controlling the second arm swing mechanism 12, and disposes the rinse liquid nozzle 5 on the rotational center of the substrate W. When the rinse liquid nozzle 5 is disposed on the rotational center of the substrate W, the controller 20 again opens the rinse liquid valve 16 so as to discharge DIW from the rinse liquid nozzle 5 toward the middle of the upper surface of the substrate W. The discharge flow amount of DIW discharged from the rinse liquid nozzle 5 at this time is set at, for example, 2.0 (liter/minute). During a period of time during which a shift is performed from the chemical liquid puddle step (step S14) to the puddle rinse step (step S15), the rotation speed of the substrate W is maintained at a puddle speed, and therefore the upper surface of the substrate W continues being entirely covered with a liquid film 30 of a puddled chemical liquid throughout this period, and the upper surface of the substrate W avoids being exposed.

Figure 6D:
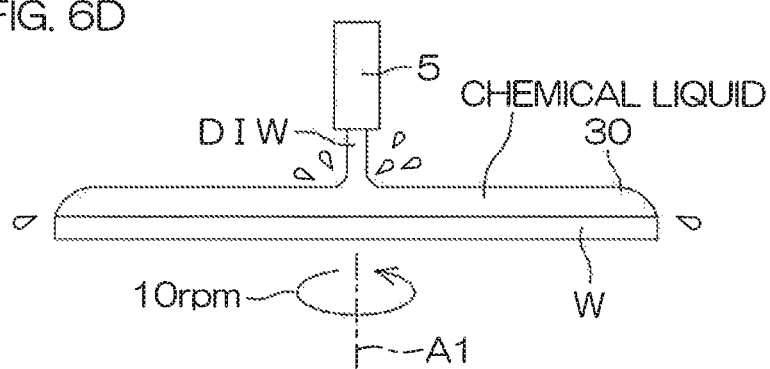
FIG. 6D is a view showing processing performed subsequent to FIG. 6C.

When DIW is further supplied from the rinse liquid nozzle 5 toward the center portion of the liquid film as shown in FIG. 6D, the liquid film 30 of the chemical liquid on the substrate W is successively pushed out from the center portion of the substrate W to the outside of the substrate W, and is discharged outwardly from the peripheral edge of the substrate W, and is replaced with DIW.

Figure 6E:
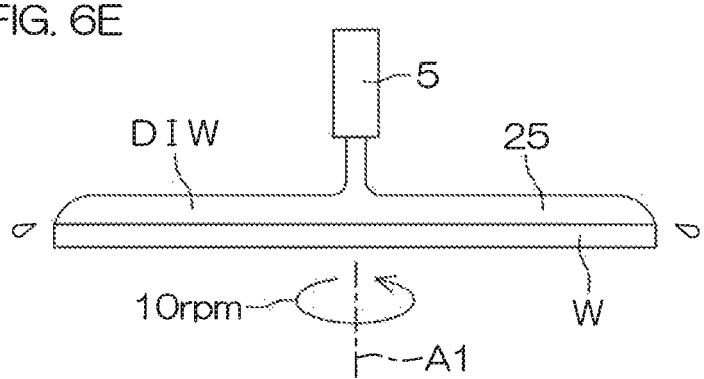
FIG. 6E is a view showing processing performed subsequent to FIG. 6D.

When a predetermined period of time elapses, all of the liquid film 30 of the chemical liquid on the substrate W is replaced by DIW, and the liquid film 25 of DIW is formed in the whole area of the upper surface of the substrate W in a puddled state as shown in FIG. 6E. The chemical liquid adhering to this upper surface is rinsed away by this liquid film 25 of DIW in the whole area of the upper surface of the substrate W.

The substrate rotation speed in the puddle rinse step (step S15) is set at a puddle speed (e.g., 10 rpm). A centrifugal force that acts on the chemical liquid or DIW placed on the substrate W is small, and therefore the chemical liquid or DIW is restrained in amount from scattering outwardly from the peripheral edge of the substrate W. The substrate W is rotated at the puddle speed in this way, and therefore the liquid film 25 of puddled DIW continues being held on the upper surface of the substrate W throughout the puddle rinse step (step S15). This makes it possible for the front surface of the substrate W to reliably avoid being exposed in the puddle rinse step (step S15).

When a predetermined rinsing period of time (e.g., about 30 seconds) elapses after starting to discharge DIW, the controller 20 closes the rinse liquid valve 16, and stops to discharge DIW from the rinse liquid nozzle 5, and the controller 20 returns the rinse liquid nozzle 5 that has stopped to discharge DIW to its home position while controlling the second arm swing mechanism 12. Thereafter, the controller 20 performs an IPA liquid replacing step (low surface tension liquid replacing step: step S16) and a drying step (step S17) in this order, and then the controller 20 stops the rotation of the spin chuck 3 (rotation of the substrate W) (step S18). Each of steps S16 and S17 is a step equal to each of steps S5 and S6 of the first processing example shown in FIG. 3. As a result, washing applied to the single substrate W is ended, and the already-processed substrate W is carried out from the processing chamber 2 by means of the transfer robot (step S19).

Figure 7A:
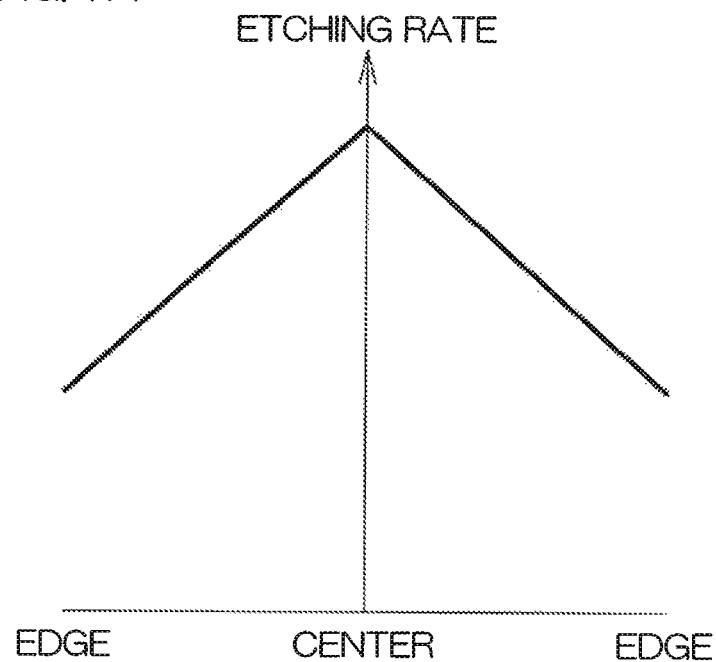
FIG. 7A is a view showing the in-plane distribution of an etching rate in a chemical liquid puddle step.
Figure 7B:
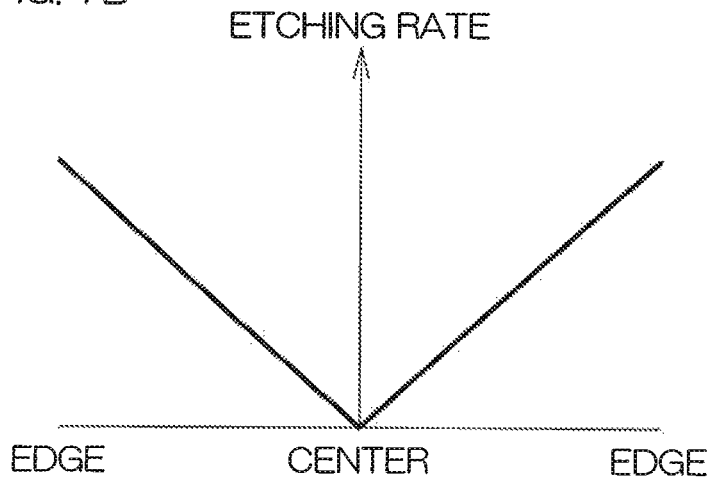
FIG. 7B is a view showing the in-plane distribution of an etching rate in a puddle rinse step.

FIG. 7A is a view showing an in-plane distribution of an etching rate in the chemical liquid puddle step (S14). FIG. 7B is a view showing an in-plane distribution of an etching rate in the puddle rinse step (S15).

As described above, in the second processing example, the pre-wet step (S13) is performed a single step before performing the chemical liquid puddle step (S14), and the liquid film 25 of DIW is formed on the front surface of the substrate W. In the chemical liquid puddle step (S14), DIW is successively replaced with the chemical liquid from the center portion of the liquid film 25 of DIW toward the peripheral edge thereof as shown in FIG. 6B, and therefore the replacing speed from DIW to the chemical liquid gradually becomes lower in proportion to an approach from the center portion of the substrate W to the peripheral edge thereof. As a result, as shown in FIG. 7A, the etching rate in the chemical liquid puddle step (S14) gradually becomes lower in proportion to an approach from the rotational center of the substrate W to the peripheral edge thereof.

On the other hand, in the puddle rinse step (S15), the chemical liquid is successively replaced with DIW from the center portion of the liquid film 30 of the chemical liquid toward the peripheral edge thereof as shown in FIG. 6D, and therefore the replacing speed from the chemical liquid to DIW gradually becomes lower in proportion to an approach from the center portion of the substrate W to the peripheral edge thereof. As a result, contrary to that in the chemical liquid puddle step (S14), the etching rate in the puddle rinse step (S15) gradually becomes higher in proportion to an approach from the rotational center of the substrate W to the peripheral edge thereof as shown in FIG. 7B.

Thus, etching characteristics between both steps is offset by combining together the two steps (S14, S15) that differ from each other in etching characteristics. As a result, a difference in the etching rate between the center of the substrate W and the peripheral edge thereof is reduced. In the entire process of washing (etching) including both of the chemical liquid puddle step (S14) and the puddle rinse step (S15), it is possible to maintain the in-plane uniformity of the etching rate, and it is possible to uniformly etch the upper surface (front surface) of the substrate W.

FIG. 8 is a flowchart showing a third processing example of washing performed by the substrate processing apparatus 1. The third processing example shown in FIG. 8 differs from the first and second processing examples shown in FIG. 3 in the fact that the supply position of DIW from the rinse liquid nozzle 5 in the substrate W is scanned while performing the puddle rinse step (S4, S15). Specifically, during a period from the start to the end of the execution of the puddle rinse step (S4, S15), the controller 20 moves the rinse liquid nozzle 5 on the upper surface of the substrate W while controlling the second arm swing mechanism 12. In this case, for example, a half scan (reciprocation) method is employed in which the supply position of DIW from the rinse liquid nozzle 5 in the substrate W is reciprocated and scanned between the rotational center of the substrate W and the peripheral edge of the substrate W.

In the puddle rinse step (S4, S15), the supply position of DIW in the substrate W is scanned, and therefore a liquid film (a mixed liquid film of a chemical liquid and DIW) on the upper surface of the substrate W is stirred, thus making it possible to improve the replacing efficiency from the chemical liquid to DIW. As a result, it is possible to improve the rinse efficiency in the puddle rinse step (S4, S15).

Additionally, as shown by parentheses in FIG. 8, the supply position of the chemical liquid from the chemical liquid nozzle 4 in the substrate W may be scanned during the execution of the chemical liquid puddle step (S3, S14). Specifically, during a period from the start to the end of the execution of the chemical liquid puddle step (S3, S14), the controller 20 moves the chemical liquid nozzle 4 on the upper surface of the substrate W while controlling the first arm swing mechanism 42. In this case, for example, a half scan (reciprocation) method is employed in which the supply position of a chemical liquid from the chemical liquid nozzle 4 in the substrate W is reciprocated and scanned between the rotational center of the substrate W and the peripheral edge of the substrate W.

In the chemical liquid puddle step (S3, S14), the supply position of the chemical liquid in the substrate W is scanned, and therefore the liquid film of the chemical liquid on the upper surface of the substrate W is stirred, and a fresh chemical liquid immediately after being discharged from the chemical liquid nozzle 4 is brought into contact with the upper surface of the substrate W, and, as a result, it is possible to improve the processing efficiency of the chemical liquid (the etching efficiency if the chemical liquid is an etching liquid such as that mentioned above) in the chemical liquid puddle step (S3, S14).

FIG. 9 is a flowchart showing a fourth processing example of washing performed by the substrate processing apparatus 1.

In this fourth processing example, during a predetermined time period part of the execution time of the puddle rinse step (S4, S15), the supply position of DIW supplied from the rinse liquid nozzle 5 in the substrate W is fixed at the rotational center of the substrate W in a stationary state, and, when this predetermined time period part elapses, the supply position of DIW in the substrate W is reciprocated and scanned between the rotational center of the substrate W and the peripheral edge of the substrate W in the same way as in the third processing example.

In this fourth processing example, the same operational effect as in the third processing example is fulfilled.

Additionally, as shown by parentheses in FIG. 9, during a predetermined time period part of the execution time of the chemical liquid rinse step (S3, S14), the supply position of a chemical liquid supplied from the chemical liquid nozzle 4 in the substrate W may be fixed at the rotational center of the substrate W in a stationary state, and, when this predetermined time period part elapses, the supply position of the chemical liquid in the substrate W maybe reciprocated and scanned between the rotational center of the substrate W and the peripheral edge of the substrate W in the same way as in the third processing example.

In the fourth processing example, the supply position of DIW or of a chemical liquid may be previously scanned, and thereafter maybe fixed at the rotational center of the substrate W in a stationary state.

Therefore, according to the present preferred embodiment, the liquid film of a chemical liquid with which the upper surface of a substrate W is covered is held on the upper surface thereof in the chemical liquid puddle step (S3, S14). Subsequent to the end of the chemical liquid puddle step (S3, S14), the liquid film of the chemical liquid held on the upper surface of the substrate W is replaced with DIW. The liquid film of DIW with which the upper surface of the substrate W is covered is held on the upper surface thereof by the rinse liquid replacement, and a chemical liquid adhering to the upper surface of the substrate W is rinsed away by the liquid film of the rinse liquid (puddle rinse step of S4, S15). The liquid film of the chemical liquid held by the substrate W is replaced with DIW, and the liquid film of DIW is formed on the upper surface of the substrate W, and therefore the upper surface of the substrate W is not exposed when a shift is performed from chemical liquid treatment to rinsing. This makes it possible to apply chemical liquid treatment and rinsing onto the upper surface of the substrate W without undergoing a process in which the upper surface of the substrate W is exposed.

Additionally, the rotation speed of the substrate W is held at a puddle speed (e.g., 10 rpm) throughout the entire period of time of chemical liquid treatment. Therefore, the chemical liquid discharged from the substrate W is restrained or prevented from hitting peripheral members and from rebounding to the substrate W. Therefore, particles included in the chemical liquid that has rebounded are restrained or prevented from adhering to the substrate W. This makes it possible to raise the cleanliness of the substrate W.

Although one preferred embodiment of the present invention has been described as above, the present invention can be embodied in other modes.

For example, with respect to the supply of a rinse liquid (DIW), a supply method shown in FIGS. 10A to 10C and FIG. 11 can also be employed although a rinse liquid (DIW) in the puddle rinse step (S4, S15) is supplied by use of only the rinse liquid nozzle 5 as described in the aforementioned preferred embodiment as an example.

Figure 10A:
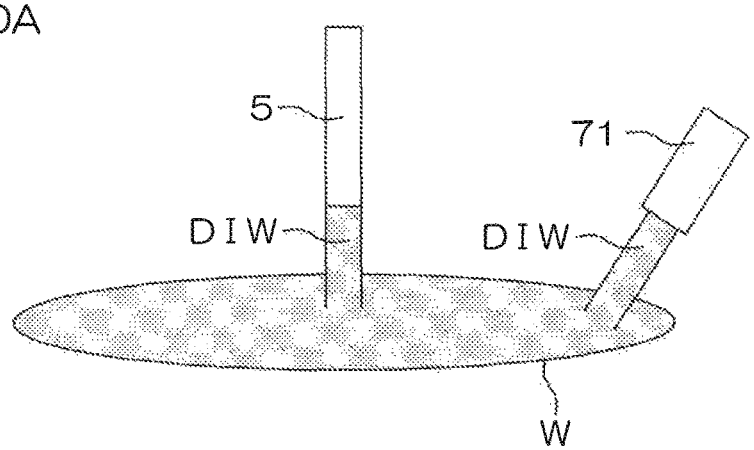
FIG. 10A is a view showing a first modification of the present invention.

In a modification of FIG. 10A, a nozzle 71 to supply DIW to a center portion of a substrate W is disposed independently of the rinse liquid nozzle 5. The nozzle 71 is, for example, a straight nozzle through which DIW that is a rinse liquid is discharged in a continuous flow state, and its discharge port is fixedly disposed in a space above the spin chuck 3 (see FIG. 1) toward the peripheral edge of the substrate W. DIW from a DIW supply source is arranged to be supplied to the nozzle 71. While the puddle rinse step (S4, S15) is being performed, DIW from the rinse liquid nozzle 5 is supplied to the center portion of the substrate W, and, simultaneously, DIW from the nozzle 71 is also supplied to the peripheral edge of the substrate W. Therefore, an increase in the supply flow rate of DIW to the substrate W is realized during the execution of the puddle rinse step (S4, S15).

Figure 10B:
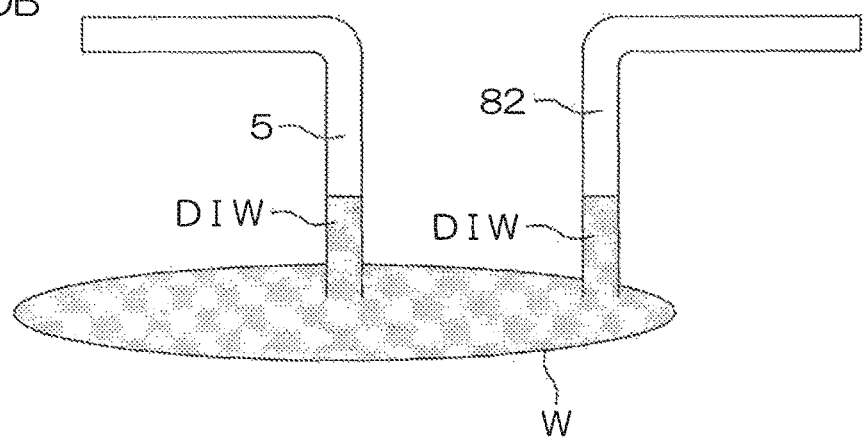
FIG. 10B is a view showing a second modification of the present invention.

The modification of FIG. 10B differs from the modification of FIG. 10A in the fact that a nozzle 82 that has the aforementioned scan form and through which DIW is discharged is provided instead of the nozzle 71. DIW from a DIW supply source is also arranged to be supplied to the nozzle 82.

The nozzle 82 is disposed at a position at which its discharge port is directed to the peripheral edge of the substrate W prior to performing the puddle rinse step (S4, S15). While the puddle rinse step (S4, S15) is being performed, DIW from the rinse liquid nozzle 5 is supplied to the center portion of the substrate W, and, simultaneously, DIW from the nozzle 82 is also supplied to the peripheral edge of the substrate W in the same way as in FIG. 10A.

Figure 10C:
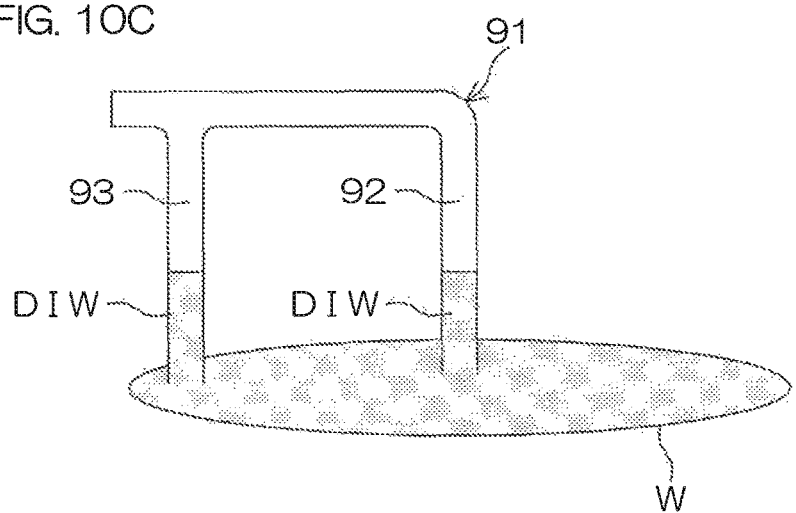
FIG. 10C is a view showing a third modification of the present invention.

The modification of FIG. 10C differs from the modification of FIG. 10A in the fact that a rinse liquid nozzle 91 that has the aforementioned scan nozzle form and that has two discharge ports 92 and 93 is provided instead of the rinse liquid nozzle 5. The discharge ports 92 and 93 are each disposed in a state of being directed downwardly. DIW from a DIW supply source is also arranged to be supplied to the rinse liquid nozzle 91 through a valve (not shown), and DIW is downwardly discharged from each of the discharge ports 92 and 93 in a state in which the valves are open.

Figure 11:
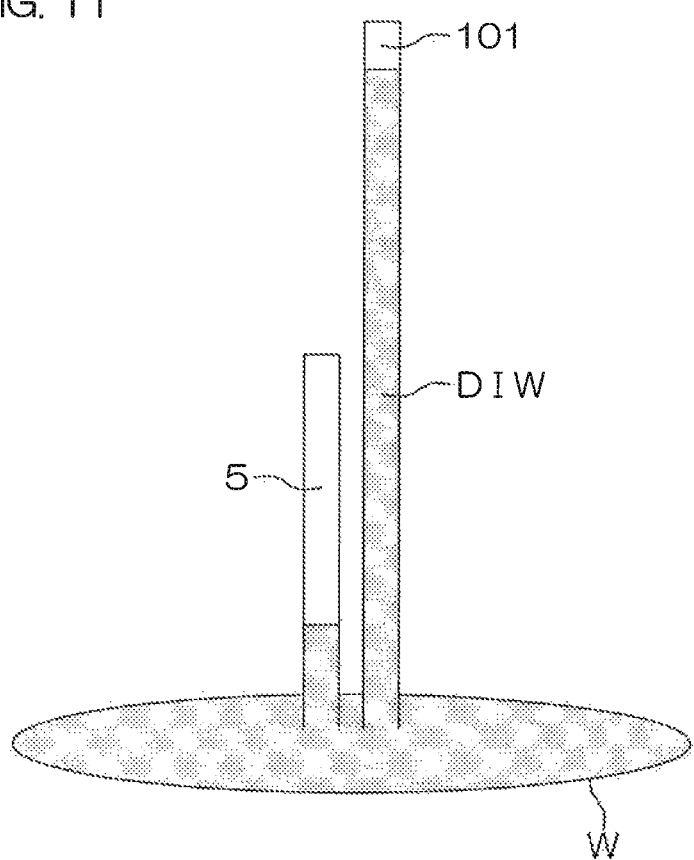
FIG. 11 is a view showing a fourth modification of the present invention.

In a modification of FIG. 11, when the puddle rinse step (S4, S15) is performed, DIW is supplied to the front surface of the substrate W by use of a ceiling nozzle 101 disposed on a ceiling wall surface of the processing chamber 2 (see FIG. 1). This ceiling nozzle 101 is to discharge DIW that serves as washing water onto an arm that swingably supports the nozzle or onto a blocking member that blocks a space on the front surface of the substrate W from its surroundings. The ceiling nozzle 101 is, for example, a straight nozzle through which DIW is discharged in a continuous flow state, and its discharge port is fixedly disposed in a space above the spin chuck 3 (see FIG. 1) toward the neighborhood of the rotational center of the substrate W. DIW from a DIW supply source is arranged to be supplied to the ceiling nozzle 61.

When the puddle rinse step (S4, S15) starts being performed, DIW from the ceiling nozzle 101 starts being discharged while the DIW discharge amount of DIW discharged from the rinse liquid nozzle 5 is maintained to have the same discharge amount as before. As a result, during the execution of the puddle rinse step (S4, S15), not only DIW flowing from the rinse liquid nozzle 5 but also DIW flowing from the ceiling nozzle 101 is supplied to the center portion of the substrate W. Therefore, an increase in the supply flow rate of DIW to the substrate W is realized during the execution of the puddle rinse step (S4, S15).

The modifications shown in FIGS. 10A to 10C and FIG. 11 can also be employed for the supply of a chemical liquid in the chemical liquid puddle step (S4, S15) although the modifications concerning a method for supplying a rinse liquid (DIW) in the puddle rinse step (S4, S15) have been shown in FIGS. 10A to 10C and FIG. 11.

In the first and second processing examples of the first preferred embodiment, an operation to make a shift from the chemical liquid puddle step (S3, S14) to the puddle rinse step (S4, S15) is performed such that the chemical liquid nozzle 4 is first returned to its home position, and then the rinse liquid nozzle 5 is moved from the home position to a position facing the substrate W. Therefore, the supply of the liquid to the front surface of the substrate W is temporarily stopped. However, if the rinse liquid nozzle 5 and the chemical liquid nozzle 4 are attached to the same arm (e.g., the second arm 10), it is possible to start the supply of the rinse liquid from the rinse liquid nozzle 5 immediately after the chemical liquid nozzle 4 stops the supply of the chemical liquid. In this case, a liquid continues being supplied to the liquid film of the chemical liquid on the upper surface of the substrate W, and therefore it is possible to allow the upper surface of the substrate W to more reliably avoid being exposed when a shift is made from the chemical liquid puddle step (step S3, S14) to the puddle rinse step (step S4, S15).

Additionally, although half scanning is employed as a scan form of the supply position of DIW or a chemical liquid in the substrate W as described as an example in the third and fourth preferred embodiments, variable scan in which the supply position is moved between one peripheral edge of the substrate W and another peripheral edge that faces the one peripheral edge with the rotational center of the substrate W therebetween may be employed as the scan form. Additionally, the scan form may be so-called one-way scan in which DIW or a chemical liquid from the chemical liquid nozzle 4 is supplied only during a one-way movement, not the reciprocating scan in which DIW or a chemical liquid is supplied while being reciprocated.

Additionally, although the scan nozzle form is employed for both the chemical liquid nozzle 4 and the rinse liquid nozzle 5 as described in each of the aforementioned preferred embodiments, the chemical liquid nozzle 4 or the rinse liquid nozzle 5 maybe disposed fixedly with respect to the spin chuck 3.

Additionally, although the puddle speed of the substrate W in the chemical liquid puddle step (S3, S14) and the puddle speed of the substrate W in the puddle rinse step (S4, S15) are made equal to each other as described above, these puddle speeds may differ from each other.

Additionally, although the chemical liquid puddle step (S3, S14) is performed throughout the entire period of time of the chemical liquid treatment applied onto the substrate W as described as an example in each of the aforementioned processing examples, what is required is to perform the chemical liquid puddle step (S3, S14) at least when the chemical liquid treatment is ended, and this step is not necessarily required to be performed throughout the entire period of time of the chemical liquid treatment.

Additionally, although the liquid film of DIW is held in a puddled state in the whole area of the upper surface of the substrate W by rotating the substrate W at a puddle speed in the pre-wet step (S13) as described above, what is required in the pre-wet step (S13) is to hold the liquid film on the front surface of the substrate W, and, for example, DIW having a high flow amount may be supplied to the upper surface of the substrate W, and the substrate W may be rotated at a comparatively high rotation speed (rotation speed higher than the puddle speed).

Additionally, a case in which DIW is used as the rinse liquid has been described as an example. However, the rinse liquid is not limited to DIW, and soda water, electrolyzed ion water, ozonized water, hydrochloric acid water having a diluted concentration (e.g., about 10 to 100 ppm), restoration water (hydrogenated water), or the like may be employed as the rinse liquid.

Additionally, for example, methanol, ethanol, acetone, HFE (hydrofluoroethers), etc., can be employed as the organic solvent having low surface tension, besides the IPA liquid.

Additionally, the substrate processing apparatus 1 according to the present invention is widely applicable for processing after rinsing without being limited to processing after rinsing during washing in which a silicon oxide film is removed from the front surface of the substrate W. It should be noted that the effect of the present invention is fulfilled particularly remarkably when the front surface of the substrate W is hydrophobic. Besides processing to remove a silicon oxide film, processing to remove a resist can be mentioned as an example of processing applied onto a hydrophobic substrate W.

Besides, various design changes can be made within the scope of the appended patent claims.

REFERENCE SIGNS LIST

1 Substrate processing apparatus
3 Spin chuck (Substrate holding unit)
5 Rinse liquid nozzle (Rinse liquid supply unit)
7 Spin motor (Substrate rotating unit)
14 Chemical liquid valve (Chemical liquid supply unit)
16 Rinse liquid valve (Rinse Liquid supply unit)
20 Controller (Control unit)
71 Nozzle (Rinse liquid supply unit)
82 Nozzle (Rinse liquid supply unit)
91 Nozzle (Rinse liquid supply unit)

101 Ceiling nozzle (Rinse liquid supply unit)
A1 Rotational axis
W Substrate

The invention claimed is:

1. A substrate processing method comprising:
a chemical liquid step of supplying a chemical liquid to an upper surface of a substrate held by a substrate holding unit in a horizontal posture; and
a puddle rinse step of rinsing away the chemical liquid supplied in the chemical liquid supplying step and adhering to the upper surface of the substrate by holding a liquid film of a puddled rinse liquid on the upper surface of the substrate while maintaining a rotation speed of the substrate at a fixed puddle speed;
the chemical liquid step including:
a chemical liquid covering step of supplying the chemical liquid to the substrate held by the substrate holding unit while rotating the substrate at a rotation speed so as to cover the upper surface of the substrate with a liquid film of the chemical liquid,
immediately followed by a chemical liquid puddle step of puddling the chemical liquid and holding a liquid film of the puddled chemical liquid on the upper surface of the substrate, by decreasing the rotation speed of the substrate to the fixed puddle speed and maintaining the rotation speed of the substrate at the fixed puddle speed after a completion of the decrease of the rotation speed, the puddle rinse step being performed immediately subsequent to a finish of the chemical liquid puddle step, the supply of the chemical liquid being stopped by a beginning of the puddle rinse step;
the puddle rinse step including a step of supplying a rinse liquid different from the chemical liquid the upper surface of the substrate and then replacing the liquid film of the chemical liquid held on the upper surface of the substrate with the rinse liquid,
wherein during a period of time from the completion of the decrease of the rotation speed in the chemical liquid puddle step until an end of the puddle rinse step, the rotation speed of the substrate is maintained at the fixed puddle speed, and the fixed puddle speed is a zero speed or a speed lower than the rotation speed of the substrate in the chemical liquid covering step and
the fixed puddle speed is predetermined such that the upper surface of the substrate continues being entirely covered with the liquid film of the puddled chemical liquid and/or the rinse liquid throughout the period, whereby the upper surface of the substrate avoids being exposed throughout the period.

2. The substrate processing method according to claim 1, wherein the chemical liquid is an etching liquid.

3. The substrate processing method according to claim 1, wherein the upper surface of the substrate that has not yet undergone the puddle rinse step exhibits hydrophobic properties.

4. The substrate processing method according to claim 1, further comprising a pre-supply step of supplying water to the upper surface of the substrate and holding a liquid film of water on the upper surface prior to performing the chemical liquid step,
the chemical liquid covering step replaces the liquid film of water held on the upper surface of the substrate with the chemical liquid.

5. The substrate processing method according to claim 1, further comprising a low surface tension liquid replacing step of, after finishing the puddle rinse step, supplying a low surface tension liquid whose surface tension is lower than that of the rinse liquid to the upper surface of the substrate and then replacing a liquid film of a puddled rinse liquid held on the upper surface of the substrate with the low surface tension liquid.

6. The substrate processing method according to claim 1, further comprising a chemical liquid supply position moving step of moving a supply position of the chemical liquid in the upper surface of the substrate in the chemical liquid puddle step.

7. The substrate processing method according to claim 1, further comprising a rinse liquid supply position moving step of moving a supply position of the rinse liquid in the upper surface of the substrate in the puddle rinse step.

* * * * *